(12) United States Patent
Kang et al.

(10) Patent No.: US 7,855,925 B2
(45) Date of Patent: Dec. 21, 2010

(54) INTER-TRANSMISSION MULTI MEMORY CHIP, SYSTEM INCLUDING THE SAME AND ASSOCIATED METHOD

(75) Inventors: Uk-song Kang, Yongin-si (KR); Jung-bae Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 331 days.

(21) Appl. No.: 12/071,745

(22) Filed: Feb. 26, 2008

(65) Prior Publication Data

US 2008/0205113 A1 Aug. 28, 2008

(30) Foreign Application Priority Data

Feb. 27, 2007 (KR) .................... 10-2007-0019917

(51) Int. Cl.
*G11C 7/10* (2006.01)
(52) U.S. Cl. .................. 365/189.17; 365/52; 365/63; 365/233
(58) Field of Classification Search ............ 365/51, 365/52, 63, 230.03, 189.17, 233
See application file for complete search history.

(56) References Cited

U.S. PATENT DOCUMENTS

| 5,717,943 | A   |   | 2/1998  | Barker et al. |
| 5,740,463 | A   |   | 4/1998  | Oshima et al. |
| 5,963,745 | A   |   | 10/1999 | Collins et al. |
| 6,088,252 | A   | * | 7/2000  | Fujisawa et al. ............. 365/51 |
| 7,031,221 | B2  | * | 4/2006  | Mooney et al. ......... 365/230.05 |
| 7,411,843 | B2  | * | 8/2008  | Ruckerbauer et al. ....... 365/191 |

FOREIGN PATENT DOCUMENTS

| JP | 08-087475 | 4/1996 |
| KR | 10-2006-0038105 A | 5/2006 |
| WO | WO 2006/046801 A1 | 5/2006 |

* cited by examiner

*Primary Examiner*—Pho M Luu
*Assistant Examiner*—Tha-O Bui
(74) *Attorney, Agent, or Firm*—Lee & Morse, P.C.

(57) ABSTRACT

A multi memory chip stacked on a multi core CPU includes a plurality of memories, each memory corresponding to a CPU core from among the CPU cores and being configured to directly transmit data between the other memories of the multi memory chip.

19 Claims, 4 Drawing Sheets

INTER-TRANSMISSION MULTI MEMORY CHIP, SYSTEM INCLUDING THE SAME AND ASSOCIATED METHOD

BACKGROUND OF THE INVENTION

1. Field of the Invention

Embodiments relate to a multi memory chip. More particularly, embodiments relate to a multi memory chip in which internal data transmission between memories is possible, a system including the same, and an associated method.

2. Description of the Related Art

Due to the growth of semiconductor integrated technology, a multi core Central Processing Unit (CPU) including a plurality of CPU cores in one chip has been developed and a multi memory chip including a plurality of memories in one chip has also been developed. In addition, in order to provide high-speed and low-speed operations, a method of stacking a multi memory chip on the multi core CPU may be used.

When stacking a multi memory chip on the multi core CPU, a number of input/output pins is not limited as compared with separately packaging the multi memory chip and the multi core CPU. In addition, stacking a multi memory chip on the multi core CPU rapidly decreases a parasitic resistance, a parasitic inductance, and a parasitic capacitance. Thus, both high-speed and low-speed operations may be realized.

FIG. 1 illustrates a schematic diagram of a conventional stacking of a multi memory chip 11 on a multi core CPU 13.

Referring to FIG. 1, the multi memory chip 11 includes a plurality of memories M1-M6, and the multi core CPU 13, including a plurality of CPU cores CORE1-CORE6, is stacked with the multi memory chip 11. The CPU cores CORE1-CORE6 in the multi core CPU 13 operate independently, and respectively correspond to the memories M1-M6 of the multi memory chip 11. For example, the CPU core CORE2 corresponds to the memory ME2, and the memory ME2 is only controlled by the CPU core CORE2, and so forth.

In applications, e.g., multi-media, it may be desirable to transmit data from one of the memories to another one of the memories. For example, as illustrated in FIG. 1, when data should be transmitted from the memory M1 to the memory M2, data is first transmitted from the memory M1 to the CPU core CORE1 corresponding to the memory M1. Then, data is transmitted from the CPU core CORE1 to the CPU core CORE2 corresponding to the memory M2. Finally, data is transmitted from the CPU core CORE2 to the memory M2.

As illustrated in FIG. 1, the data transmission requires numerous steps. Thus, a transmission data path is lengthened, increasing data transmission time and latency.

SUMMARY OF THE INVENTION

Embodiments are therefore directed to a multi memory chip stacked on a multi core CPU and a system having the same, which substantially overcomes one or more of the disadvantages of the related art.

It is a feature of an embodiment to provide a multi memory chip stacked on a multi core CPU and system having a decreased data transmission time between memories of the multi memory chip It is another feature of an embodiment to provide a multi memory chip stacked on a multi core CPU and system having decreased latency.

At least one of the above and other features and advantages may be realized by providing a multi memory chip stacked on a multi core central processing unit (CPU) having a plurality of CPU cores, the multi memory chip including a plurality of memories, each memory corresponding to a CPU core and being configured to directly transmit data between the other memories of the multi memory chip.

Each memory may include an input/output sense amplifier and an input/output driver in a central region, and an input/output sense amplifier and an input/output driver in at least one of upper and lower regions. An input/output sense amplifier and an input/output driver may be in both the upper and lower regions.

When data is transmitted from a first memory to at least one of second and third memories from among the memories, the first memory may be configured to receive an instruction to read data from the first memory and transmit the data to the at least one of second and third memories, and an address of the first memory from which the data is to be read from a first CPU core corresponding to the first memory. The second memory may be configured to receive an instruction to write data received from the first memory to the second memory and an address of the second memory to which the data is to be written from a second CPU core corresponding to the second memory.

When data is transmitted from the first memory to second and third memories, the third memory may be configured to receive an instruction to write data received from the first memory to the third memory and an address of the third memory to which data is to be written, from a third CPU core corresponding to the third memory.

Each memory may be configured to receive a control signal from a corresponding CPU core and transmit data in accordance with the control signal.

Each memory may include a data port on a right side and/or a left side.

At least one of the above and other features and advantages may be realized by providing a system, including a multi memory chip including a plurality of memories, and a multi core central processing unit (CPU) including a plurality of CPU cores, each CPU core corresponding to a memory of the multi memory chip, the multi memory chip being stacked on the multi core CPU, wherein data is directly transmitted between the memories in the multi memory chip.

Memories of the multi memory chip may be controlled by respectively corresponding CPU cores of the multi core CPU.

Each memory may include an input/output sense amplifier and an input/output driver in a central region, and an input/output sense amplifier and an input/output driver an upper region and/or a lower region.

When data is transmitted from a first memory to at least one of second and third memories from among the memories, a first CPU core corresponding to the first memory may be configured to supply an instruction the first memory to read data from the first memory and transmit the data to the at least one of second and third memories, and an address of the first memory from which the data is to be read. A second CPU core corresponding to the second memory may be configured to supply an instruction the second memory to write data received from the first memory to the second memory, and an address of the second memory to which data is to be written.

When data is transmitted from the first memory to second and third memories, a third CPU core corresponding to the third memory is configured to may supply an instruction to the third memory to write data received from the first memory to the third memory, and an address of the third memory to which data is to be written.

Each memory may further include a data port on a right side and/or a left side.

At least one of the above and other features and advantages may be realized by providing a method of transmitting data in a multi memory chip stacked on a multi core central processing unit (CPU) having a plurality of CPU cores, the multi memory chip including a plurality of memories controlled by the respectively corresponding CPU cores, the method including providing a control signal from a corresponding CPU core to a corresponding memory, and directly transmitting data between memories of the multi memory chip in accordance with the control signal.

Directly transmitting may include at least one of transmitting data between upper and lower regions of adjacent memories and between left and right regions of adjacent memories.

BRIEF DESCRIPTION OF THE DRAWINGS

The above and other features and advantages of embodiments will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0019917, filed on Feb. 27, 2007, in the Korean Intellectual Property Office, and entitled: "Inter-Transmission Multi Memory Chip and System Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
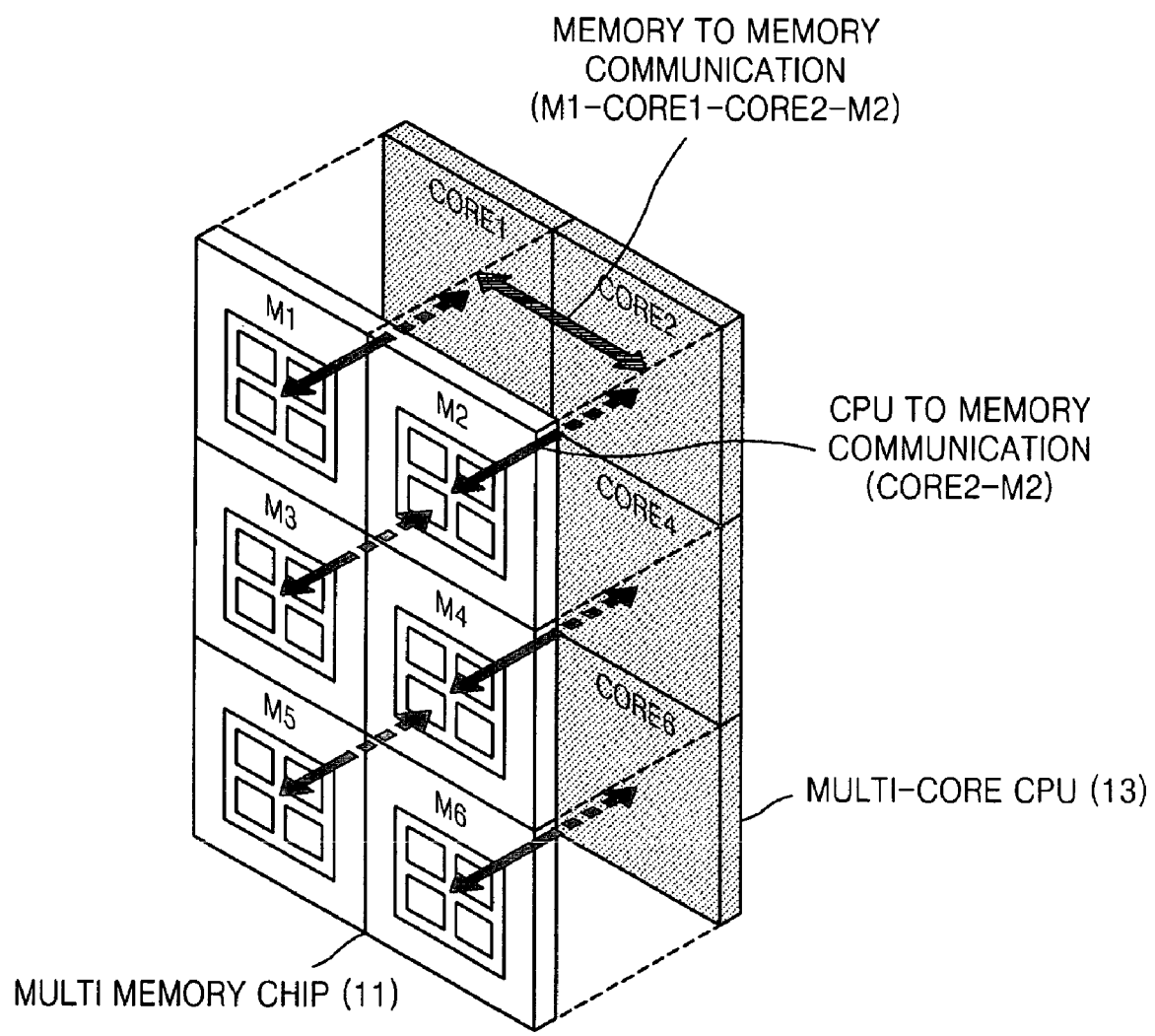
FIG. 1 illustrates a conventional data transmission path in a stacking of a multi memory chip on a multi core CPU.
Figure 2:
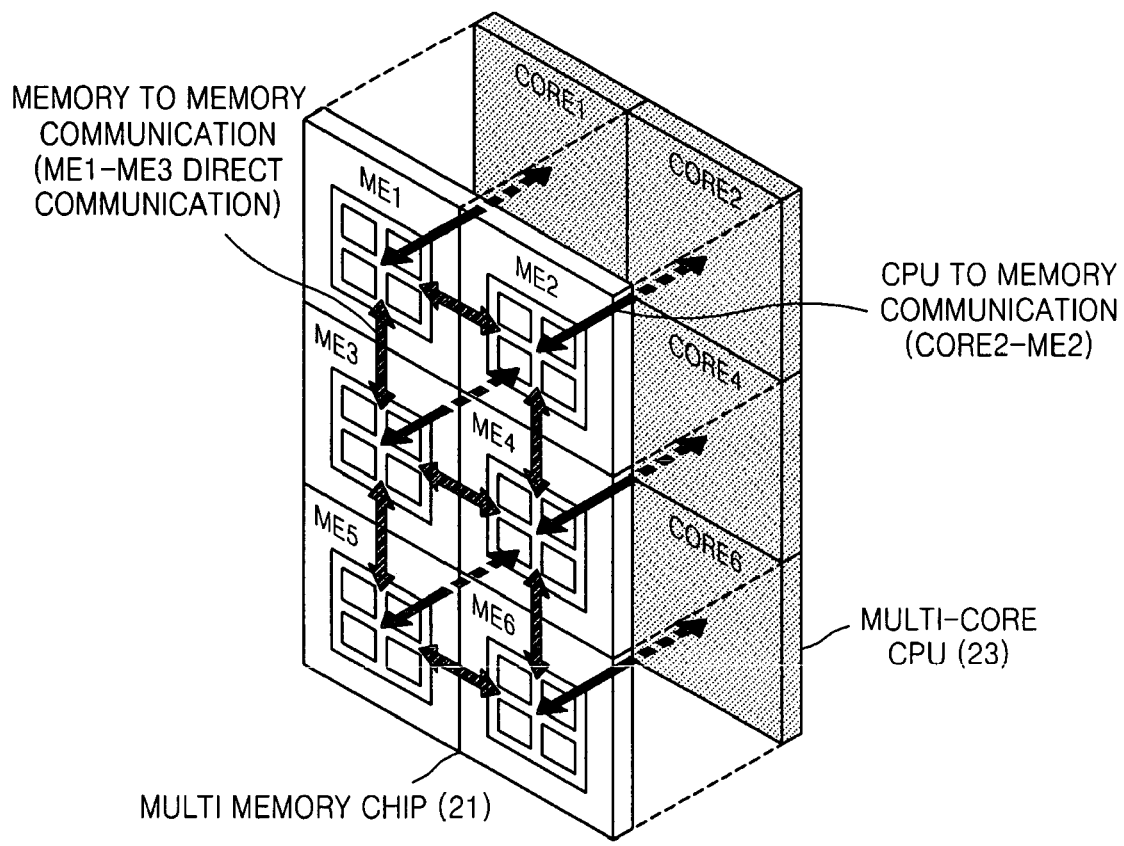
FIG. 2 illustrates a data transmission path in a stacking of a multi memory chip on a multi core CPU according to an embodiment.

FIG. 2 illustrates a schematic diagram of a data transmission path in a stacking of a multi memory chip 21 on a multi core CPU 23, according to an embodiment of the present invention. The multi core CPU 23 may include a plurality of CPU cores CORE1-CORE6. The multi memory chip 21, on which the multi core CPU 23 is stacked, may include a plurality of memories ME1-ME6.

The CPU cores CORE1-CORE6 in the multi core CPU 23 may operate independently, and respectively correspond to the memories ME1-ME6 in the multi memory chip 21. For example, the CPU core CORE1 corresponds to the memory ME1, and the memory ME1 is only controlled by the CPU core CORE1. In addition, the CPU core CORE2 corresponds to the memory ME2, and the memory ME2 is only controlled by the CPU core CORE2, and so forth.

In particular, data to be transmitted between memories of the multi memory chip 21 may not pass through the multi core CPU 23 that is stacked with the multi memory chip 21. Instead, data may be directly transmitted between memories in the multi memory chip 21. Direct data transmission between memories of the multi memory chip 21 may be possible due to data paths formed in a vertical direction and a horizontal direction between the memories ME1-ME6 in the multi memory chip 21, and a control signal from corresponding CPU cores CORE1-CORE6. The multi core CPU 23 may provide an instruction regarding data input/output during a read operation and a write operation, and may provide an address from which data is to be read or to which data is to be written in accordance with the operation.

Figure 3:
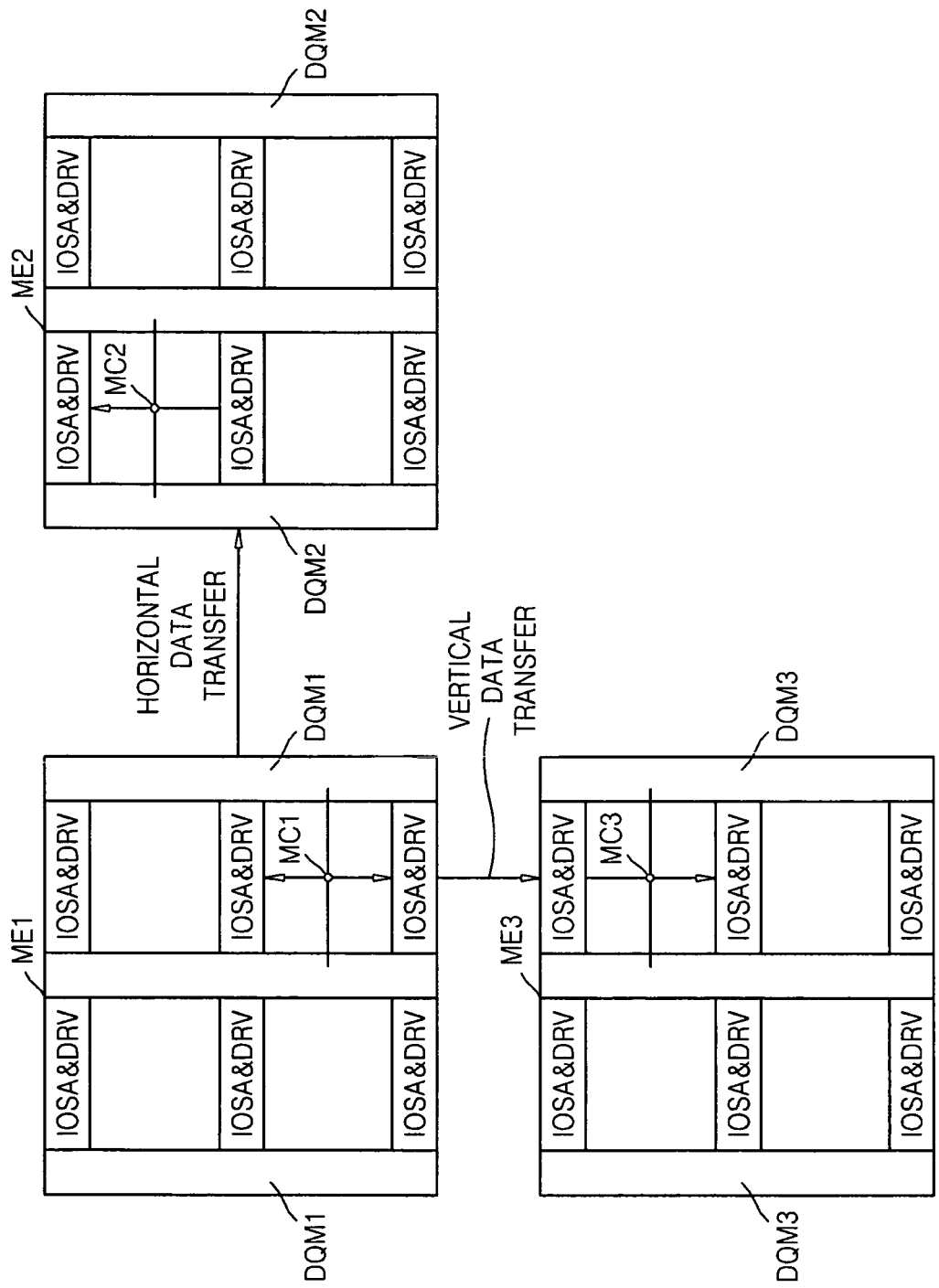
FIG. 3 illustrates a schematic diagram of examples of data transmission paths in a vertical direction and a horizontal direction between memories in the multi memory chip of FIG. 2.

FIG. 3 illustrates a schematic diagram of examples of data paths in a vertical direction and a horizontal direction between the memories ME1-ME6 in the multi memory chip 21 of FIG. 2, according to an embodiment. In the present embodiment, for convenience of explanation, only three memories ME1, ME2, and ME3 from among the memories ME1-ME6 of the multi memory chip 21 of FIG. 2 are illustrated. Each memory ME1-ME6 may include memory cells MC1, MC2, etc.

Unlike the conventional memory, the memories ME1, ME2, and ME3 may further include an input/output sense amplifier IOSA and an input/output driver DRV at upper and lower regions of the memories ME1, ME2, and ME3 in order to transmit data in a vertical direction, in addition to an IOSA and a DRV in a central region. Further, data ports DQM1, DQM2, and DQM3 may be provided at right and left parts of the central region of each of the memories ME1, ME2, and ME3 in order to transmit data in a horizontal direction. However, embodiments are not limited thereto, and other arrangement allowing other data transmission paths may be realized. Further, while FIGS. 2 and 3 illustrate the CPU cores CORE1-CORE6 only providing a control signal directly to the central region of corresponding memories ME1-ME6, other arrangements may be realized.

Figure 4:
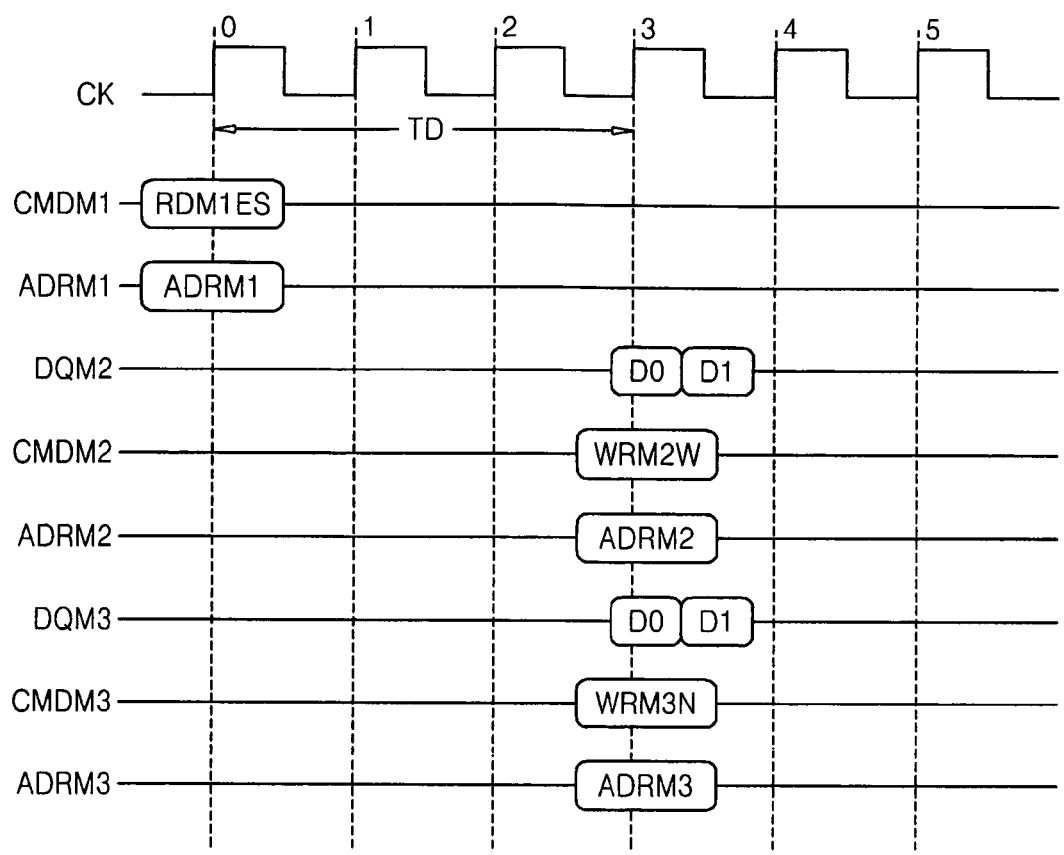
FIG. 4 illustrates a timing diagram for transmitting data between memories as illustrated in FIG. 3.

FIG. 4 illustrates a timing diagram of when data is transmitted from memory ME1 to memories ME2 and ME3 as illustrated in FIG. 3, according to an embodiment of the present invention. Data transmission may be synchronized with a clock signal CLK.

Operation of the multi memory chip 21 of FIG. 3 will be described with reference to the timing diagram of FIG. 4. First, an instruction RDM1ES, which is an instruction to read data from the memory ME1 and to transmit the data to the memories ME2 and ME3, and an address ADRM1, which is an address of the memory ME1 from which data is to be read, from the CPU core CORE1 corresponding to the memory ME1, may be provided to the memory ME1.

Then, data D0 and D1 of memory cells MC1 designated by the address ADRM1 in the memory ME1 may be read using the IOSA at the central region of the memory ME1 and is transmitted from the data port DQM1 to the data port DQM2 of the memory ME2 in a horizontal direction. In addition, data D0 and D1 of the memory cells MC1 of the memory ME1 may be read using the IOSA at the lower region of the memory ME1 and transmitted to the data port DQM3 of the memory ME3 in a vertical direction.

Then, an instruction WRM2W, which is an instruction to write data received from the memory ME1 to the memory ME2, and an address ADRM2, which is an address of the memory ME2 to which data is to be written, from the CPU core CORE2 corresponding to the memory ME2 is provided to the memory ME2. Then, data D0 and D1 received through the data port DQM2 from the memory ME1 is written on memory cells MC2 designated by the address ADRM2 through the corresponding input/output driver DRV in the memory ME2.

In addition, an instruction WRM3N, which is an instruction to write data received from the memory ME1 to the memory ME3, and an address ADRM3, which is an address of the memory ME3 to which data is to be written, from the CPU core CORE3 corresponding to the memory ME3 is provided to the memory ME3. Then, data D0 and D1 received through the data port DQM3 from the memory ME1 is written on memory cells MC3 of the memory ME3 designated by the address ADRM3 through the corresponding input/output driver DRV in the memory ME3.

In FIG. 4, after the instruction RDM1ES and the address ADRM1 are applied to the memory ME1, the timing diagram illustrates a delay time TD after which the data D0 and D1 read from the memory cells MC1 of the memory ME1 arrive at the data port DQM2 of the memory ME2 and the data port DQM3 of the memory ME3.

The description above illustrates data being read from the memory ME1 and simultaneously transmitted to the memories ME2 and ME3. However, data read from the memory ME1 may be transmitted to only one of the memories ME2 and ME3 or may be sequentially transmitted to the memories ME2 and ME3.

As described above, in the multi memory chip according to the present invention, data may be directly transmitted between the memories in the multi memory chip without passing through the corresponding multi core CPU of the memories. Thus, the transmission time between the memories of the multi memory chip may be reduced, and thus, latency may be decreased.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A multi memory chip stacked on a multi core central processing unit (CPU) having a plurality of CPU cores, the multi memory chip comprising:
    a plurality of memories arranged in a vertical direction and a horizontal direction, each memory corresponding to a CPU core and being configured to directly transmit data between the other memories of the multi memory chip, wherein each memory includes:
    a first input/output sense amplifier and a first input/output driver in a first region to transmit data between memories arranged in the horizontal direction; and
    a second additional input/output sense amplifier and a second input/output driver in a second region to transmit data between memories arranged in the vertical direction.

2. The multi memory chip as claimed in claim 1, wherein the first regions is a central region; and the second region is one of upper and lower regions.

3. The multi memory chip as claimed in claim 2, further comprising a third input/output sense amplifier and a third input/output driver in a third region, the third region being one of the upper and lower regions other than the second region.

4. The multi memory chip as claimed in claim 1, wherein, when data is transmitted from a first memory to at least one of second and third memories from among the memories, the first memory is configured to receive an instruction to read data from the first memory and transmit the data to the at least one of second and third memories, and an address of the first memory from which the data is to be read from a first CPU core corresponding to the first memory.

5. The multi memory chip as claimed in claim 4, wherein the second memory is configured to receive an instruction to write data received from the first memory to the second memory and an address of the second memory to which the data is to be written from a second CPU core corresponding to the second memory.

6. The multi memory chip as claimed in claim 5, wherein, when data is transmitted from the first memory to second and third memories, the third memory is configured to receive an instruction to write data received from the first memory to the third memory and an address of the third memory to which data is to be written, from a third CPU core corresponding to the third memory.

7. The multi memory chip as claimed in claim 1, wherein each memory is configured to receive a control signal from a corresponding CPU core and transmit data in accordance with the control signal.

8. The multi memory chip as claimed in claim 1, wherein each memory further comprises a data port on at least one a right side and a left side.

9. The multi memory chip as claimed in claim 8, wherein each memory further comprises a data port on both the right side and the left side.

10. The multi memory chip as claimed in claim 1, wherein each memory further comprises a data port on at least one a right side and a left side.

11. The system as claimed in claim 10, wherein, when data is transmitted from the first memory to second and third memories, a third CPU core corresponding to the third memory is configured to supply an instruction to the third memory to write data received from the first memory to the third memory, and an address of the third memory to which data is to be written.

12. The multi memory chip as claimed in claim 10, wherein each memory further comprises a data port on both the right side and the left side.

13. A system, comprising:
    a multi memory chip including a plurality of memories arranged in a vertical direction and a horizontal direction; and
    a multi core central processing unit (CPU) including a plurality of CPU cores, each CPU core corresponding to a memory of the multi memory chip, the multi memory chip being stacked on the multi core CPU,
    wherein data is directly transmitted between the memories in the multi memory chip,
    wherein each memory includes:
    a first input/output sense amplifier and a first input/output driver in a first region to transmit data between memories arranged in the horizontal direction; and
    a second additional input/output sense amplifier and a second input/output driver in a second region to transmit data between memories arranged in the vertical direction.

14. The system as claimed in claim 13, wherein the memories of the multi memory chip are controlled by respectively corresponding CPU cores of the multi core CPU.

15. The system as claimed in claim 13, wherein
    the first region is a central region; and
    the second region is one of upper and lower regions.

16. The system as claimed in claim 15, further comprising a third input/output sense amplifier and a third input/output driver in a third region, the third region being one of the upper and lower regions other than the second region.

17. The system as claimed in claim 13, when data is transmitted from a first memory to at least one of second and third memories from among the memories, a first CPU core corresponding to the first memory is configured to supply an instruction the first memory to read data from the first memory and transmit the data to the at least one of second and third memories, and an address of the first memory from which the data is to be read.

18. The system as claimed in claim 17, wherein a second CPU core corresponding to the second memory is configured to supply an instruction the second memory to write data received from the first memory to the second memory, and an address of the second memory to which data is to be written.

19. A method of transmitting data in a multi memory chip stacked on a multi core central processing unit (CPU) having a plurality of CPU cores, the multi memory chip including a plurality of memories controlled by the respectively corresponding CPU cores, the method comprising:

providing a control signal from a corresponding CPU core to a corresponding memory; and directly transmitting data between memories of the multi memory chip in accordance with the control signal, wherein directly transmitting includes at least one of transmitting data between left and right regions of adjacent memories using a first input/output sense amplifier and an input/output driver in a first region of the memories and transmitting data between upper and lower regions of adjacent memories using a second input/output sense amplifier and an second input/output driver in a second region of the memories.

* * * * *